(12) United States Patent
Werkhoven

(10) Patent No.: US 9,716,148 B2
(45) Date of Patent: Jul. 25, 2017

(54) METHODS OF FORMING SEMICONDUCTOR STRUCTURES INCLUDING III-V SEMICONDUCTOR MATERIAL USING SUBSTRATES COMPRISING MOLYBDENUM, AND STRUCTURES FORMED BY SUCH METHODS

(71) Applicant: Soitec, Bernin (FR)

(72) Inventor: Christiaan J. Werkhoven, Gilbert, AZ (US)

(73) Assignee: Soitec, Bernin (FR)

(*) Notice: Subject to any disclaimer, the term of this patent is extended or adjusted under 35 U.S.C. 154(b) by 0 days.

(21) Appl. No.: 14/579,390

(22) Filed: Dec. 22, 2014

(65) Prior Publication Data

US 2015/0144958 A1  May 28, 2015

Related U.S. Application Data

(62) Division of application No. 13/416,697, filed on Mar. 9, 2012, now Pat. No. 8,916,483.

(51) Int. Cl.
*H01L 29/20* (2006.01)
*H01L 21/762* (2006.01)
*H01L 21/265* (2006.01)
*H01L 29/205* (2006.01)

(52) U.S. Cl.
CPC ...... *H01L 29/2003* (2013.01); *H01L 21/2654* (2013.01); *H01L 21/76251* (2013.01); *H01L 21/76254* (2013.01); *H01L 29/20* (2013.01); *H01L 29/205* (2013.01)

(58) Field of Classification Search
CPC ........... H01L 29/2003; H01L 21/76251; H01L 21/76254; H01L 29/205
See application file for complete search history.

(56) References Cited

U.S. PATENT DOCUMENTS

| | | |
|---|---|---|
| 6,146,250 A | 11/2000 | Nagabushnam et al. |
| 6,303,468 B1 | 10/2001 | Aspar et al. |
| 6,328,796 B1 | 12/2001 | Kub et al. |

(Continued)

FOREIGN PATENT DOCUMENTS

| | | |
|---|---|---|
| AT | 534759 T | 12/2011 |
| AT | 514180 A1 | 10/2014 |

(Continued)

OTHER PUBLICATIONS

Q.-Y. Tong, U. Gosele, "Semiconductor Wafer Bonding", Annual Review of Materials Science, vol. 28, pp. 215-241 (Year 1998).*

(Continued)

*Primary Examiner* — Amar Movva
(74) *Attorney, Agent, or Firm* — TraskBritt

(57) ABSTRACT

Methods of fabricating semiconductor structures include the formation of molybdenum nitride at one or more surfaces of a substrate comprising molybdenum, and providing a layer of III-V semiconductor material, such as GaN, over the substrate. Semiconductor structures formed by methods described herein may include a substrate comprising molybdenum, molybdenum nitride at one or more surfaces of the substrate, and a layer of GaN bonded to the molybdenum nitride.

19 Claims, 4 Drawing Sheets

(56) References Cited

U.S. PATENT DOCUMENTS

| | | |
|---|---|---|
| 6,335,258 B1 | 1/2002 | Aspar et al. |
| 6,756,286 B1 | 6/2004 | Moriceau et al. |
| 6,809,044 B1 | 10/2004 | Aspar et al. |
| 6,867,067 B2 | 3/2005 | Ghyselen |
| 6,946,365 B2 | 9/2005 | Aspar et al. |
| 6,964,914 B2 | 11/2005 | Ghyselen et al. |
| 7,071,029 B2 | 7/2006 | Ghyselen et al. |
| RE39,484 E | 2/2007 | Bruel |
| 7,407,869 B2 | 8/2008 | Ghyselen et al. |
| 7,422,957 B2 | 9/2008 | Ghyselen et al. |
| 7,465,991 B2 | 12/2008 | Ghyselen et al. |
| 7,482,674 B1 | 1/2009 | Freitas et al. |
| 7,622,330 B2 | 11/2009 | Ghyselen et al. |
| 7,635,635 B2 | 12/2009 | Yilmaz et al. |
| 7,655,537 B2 | 2/2010 | Ghyselen et al. |
| 7,732,301 B1 | 6/2010 | Pinnington et al. |
| 7,741,678 B2 | 6/2010 | Ghyselen et al. |
| 8,101,451 B1 | 1/2012 | Murali et al. |
| 8,101,498 B2 | 1/2012 | Pinnington et al. |
| 2003/0064535 A1 | 4/2003 | Kub et al. |
| 2006/0255341 A1* | 11/2006 | Pinnington ............ B82Y 20/00 257/79 |
| 2006/0261336 A1 | 11/2006 | Ohnuma et al. |
| 2007/0072324 A1 | 3/2007 | Krames et al. |
| 2007/0241350 A1* | 10/2007 | Kim .................... H01L 21/0237 257/90 |
| 2008/0115424 A1* | 5/2008 | Can ..................... C09K 3/1445 51/309 |
| 2008/0254232 A1* | 10/2008 | Gordon ................ C07C 211/65 427/585 |
| 2009/0278233 A1 | 11/2009 | Pinnington et al. |
| 2011/0027975 A1 | 2/2011 | Krames et al. |
| 2011/0057165 A1 | 3/2011 | Pinnington |
| 2011/0117726 A1 | 5/2011 | Pinnington et al. |
| 2011/0127581 A1 | 6/2011 | Bethoux et al. |
| 2011/0136281 A1 | 6/2011 | Sheen |
| 2013/0234148 A1 | 9/2013 | Werkhoven |

FOREIGN PATENT DOCUMENTS

| | | |
|---|---|---|
| AU | 3213100 A | 8/2000 |
| AU | 2203702 A | 6/2002 |
| CN | 100343424 C | 10/2007 |
| CN | 101273472 A | 9/2008 |
| CN | 100442439 C | 12/2008 |
| CN | 101432846 A | 5/2009 |
| DE | 112007000825 T5 | 4/2009 |
| EP | 1338030 A2 | 8/2003 |
| EP | 1468128 A2 | 10/2004 |
| EP | 1932186 A1 | 6/2008 |
| FR | 2817395 A1 | 5/2002 |
| FR | 2835096 A1 | 7/2003 |
| FR | 2953328 A1 | 6/2011 |
| JP | 2004519093 A | 6/2004 |
| JP | 2005515150 T | 5/2005 |
| JP | 2007096331 A | 4/2007 |
| JP | 2008538658 T | 10/2008 |
| JP | 2009532913 A | 9/2009 |
| TW | 554452 B | 9/2003 |
| TW | I259221 B | 8/2006 |
| WO | 0044966 A1 | 8/2000 |
| WO | 0243124 A2 | 5/2002 |
| WO | 03062507 A2 | 7/2003 |
| WO | 2006116030 A2 | 11/2006 |
| WO | 2007036865 A1 | 4/2007 |
| WO | 2007117829 A2 | 10/2007 |
| WO | 2010011842 A2 | 1/2010 |
| WO | 2011031907 A1 | 3/2011 |
| WO | 2011067276 A1 | 6/2011 |
| WO | 2011071922 A2 | 6/2011 |

OTHER PUBLICATIONS

Amazawa et al., Nitridation of Vacuum Evaporated Molybdenum Films in H2/N2 Mixtures, J. Vac. Sci. Technol. A 16(4), Jul./Aug. 1998, pp. 2510-2516.

Nagae et al., Microstructure of a Molybdenum Nitride Layer Formed by Nitriding Molybdenum Metal, Communications of the American Ceramic Societ, May 2001, vol. 84, No. 5, p. 1175-1177.

Nagae et al., Nitriding of Dilute Mo-Ti Alloys at a Low Temperature of 1373 K, International Journal of Refractory Metals & Hard Materials, vol. 16 (1998) pp. 127-132.

Touimi et al., A Nitriding Process of Very Thin Molybdenum Films in an Expanding Microwave Plasma at Low Temperature, Innovations in Thin Film Processing and Characterisation (ITFPC 2009) IOP Conf. Series: Materials Science and Engineering 12 (2010) 4 pages.

Wang et al., Amorphous Molybdenum Nitride Thin Films Prepared by Reactive Sputter Deposition, Materials Science & Engineering B 112 (2004) pp. 42-49.

French Search Report and Opinion for French Application No. FR1252408 dated Jan. 25, 2013, 6 pages.

Miikkulainen et al, Atomic Layer Deposition of Molybdenum Nitride from Bis(tert-butylimido)-bis(dimethylamido) molybdenum and Ammonia onto Several Types of Substrate Materials with Equal Growth per Cycle, Chem. Mater., vol. 19, pp. 263-269 (2007).

International Search Report for International Application No. PCT/IB2013/000564 dated May 28, 2013, 3 pages.

International Written Opinion for International Application No. PCT/IB2013/000564 dated May 28, 2013, 5 pages.

International Preliminary Report on Patentability for International Application No. PCT/IB2013/000564 dated Sep. 9, 2014, 6 pages.

* cited by examiner

METHODS OF FORMING SEMICONDUCTOR STRUCTURES INCLUDING III-V SEMICONDUCTOR MATERIAL USING SUBSTRATES COMPRISING MOLYBDENUM, AND STRUCTURES FORMED BY SUCH METHODS

CROSS-REFERENCE TO RELATED APPLICATION

This application is a divisional of U.S. patent application Ser. No. 13/416,697, filed Mar. 9, 2012, now U.S. Pat. No. 8,916,483, issued Dec. 23, 2014, the disclosure of which is hereby incorporated herein in its entirety by this reference.

TECHNICAL FIELD

The present disclosure relates to methods of forming semiconductor structures that include a III-V semiconductor material, and to semiconductor structures fanned by such methods.

BACKGROUND

Substrates that include one or more layers of semiconductor material are used to form a wide variety of semiconductor structures and devices including, for example, integrated circuit (IC) devices (e.g., logic processors and memory devices) and discrete devices, such as radiation-emitting devices (e.g., light-emitting diodes (LEDs), resonant cavity light-emitting diodes (RCLEDs), vertical cavity surface emitting lasers (VCSELs)), and radiation-sensing devices (e.g., optical sensors). Such semiconductor devices are conventionally formed in a layer-by-layer manner (i.e., lithographically) on and/or in a surface of a semiconductor substrate.

Historically, a majority of such semiconductor substrates that have been used in the semiconductor device manufacturing industry have comprised thin discs or "wafers" of silicon material. Such wafers of silicon material are fabricated by first forming a large generally cylindrical silicon single crystal ingot and subsequently slicing the single crystal ingot perpendicularly to its longitudinal axis to form a plurality of silicon wafers. Such silicon wafers may have diameters as large as about thirty centimeters (30 cm) or more (about twelve inches (12 in) or more). Although silicon wafers generally have thicknesses of several hundred microns (e.g., about 700 microns) or more, only a very thin layer (e.g., less than about three hundred nanometers (300 nm)) of the semiconductor material on a major surface of the silicon wafer is generally used to form active devices on the silicon wafer. However, in some device applications, the majority of the silicon wafer thickness may be included in the electrical path-way of one or more device structures formed from the silicon wafer, such device structures being commonly referred to as "vertical" device structures.

So-called "engineered substrates" have been developed that include a relatively thin layer of semiconductor material (e.g., a layer having a thickness of less than about three hundred nanometers (300 nm)) disposed on a layer of dielectric material (e.g., silicon dioxide ($SiO_2$), silicon nitride ($Si_3N_4$), or aluminum oxide ($Al_2O_3$)). Optionally, the layer of dielectric material may be relatively thin (e.g., too thin to enable handling by conventional semiconductor device manufacturing equipment), and the semiconductor material and the layer of dielectric material may be disposed on a relatively thicker host or base substrate to facilitate handling of the overall engineered substrate by manufacturing equipment. As a result, the base substrate is often referred to in the art as a "handle" or "handling" substrate. The base substrate may also comprise a semiconductor material other than silicon.

A wide variety of engineered substrates are known in the art and may include semiconductor materials such as, for example, silicon (Si), silicon carbide (SiC), germanium (Ge), III-V semiconductor materials, and II-VI semiconductor materials.

For example, an engineered substrate may include an epitaxial layer of III-V semiconductor material formed on a surface of a base substrate, such as, for example, aluminum oxide ($Al_2O_3$) (which may be referred to as "sapphire"). The epitaxial layer may be formed on the surface of the base substrate by a transfer process from a donor structure, for example, a donor substrate or donor ingot. The transfer from a donor structure may be desirable when the donor material is highly valuable or in scarce supply. Using such an engineered substrate, additional layers of material may be formed and processed (e.g., patterned) over the epitaxial layer of III-V semiconductor material to form one or more devices on the engineered substrate. However, the Coefficient of Thermal Expansion (CTE) mismatch (or difference) between the epitaxial layer and the base substrate comprising the engineered substrate, may influence the formation and processing of the additional layers of material. For example, if the CTE mismatch between the epitaxial layer and the base substrate is substantial, then the engineered substrate may be negatively impacted during the formation of additional layers of materials.

In an effort to address the issue of CTE mismatch between an epitaxial layer of GaN and the base substrate, it has been proposed to employ a molybdenum substrate in the formation of an engineered substrate that includes a layer of GaN on the substrate.

BRIEF SUMMARY

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In some embodiments, the present disclosure includes methods of fabricating semiconductor structures. In accordance with such methods, molybdenum nitride is formed at one or more surfaces of a substrate comprising molybdenum, and a layer of III-V semiconductor material is provided over the substrate.

In additional embodiments, the present disclosure includes semiconductor structures that include a substrate comprising molybdenum, molybdenum nitride at an at least substantially planar surface of the substrate, and a layer of GaN bonded to the molybdenum nitride.

BRIEF DESCRIPTION OF THE DRAWINGS

While the specification concludes with claims particularly pointing out and distinctly claiming what are regarded as embodiments of the invention, the advantages of embodiments of the disclosure may be more readily ascertained from the description of certain examples of embodiments of the disclosure when read in conjunction with the accompanying drawings, in which:

DETAILED DESCRIPTION

The illustrations presented herein are not meant to be actual views of any particular semiconductor material, structure, or device, but are merely idealized representations that are used to describe embodiments of the disclosure.

Any headings used herein should not be considered to limit the scope of embodiments of the invention as defined by the claims below and their legal equivalents. Concepts described in any specific heading are generally applicable in other sections throughout the entire specification.

A number of references are cited herein, the entire disclosures of which are incorporated herein in their entirety by this reference for all purposes. Further, none of the cited references, regardless of how characterized herein, is admitted as prior art relative to the invention of the subject matter claimed herein.

As used herein, the term "III-V semiconductor material" means and includes any semiconductor material that is at least predominantly comprised of one or more elements from group IIIA of the periodic table (B, Al, Ga, In, and Tl) and one or more elements from group VA of the periodic table (N, P, As, Sb, and Bi). For example, III-V semiconductor materials include, but are not limited to, GaN, GaP, GaAs, InN, InP, InAs, AN, AlP, AlAs, InGaN, InGaP, GaInN, InGaNP, GaInNAs, etc.

In some embodiments, the present disclosure includes methods of fabricating semiconductor structures that include a layer of III-V semiconductor material on a substrate comprising molybdenum. In particular, molybdenum nitride may be formed or otherwise provided at a surface of a substrate. The surface may be at least substantially planar. A layer of III-V semiconductor material, such as GaN, may be provided on the surface of the substrate. Examples of such methods are disclosed below with reference to the figures.

Figure 1:
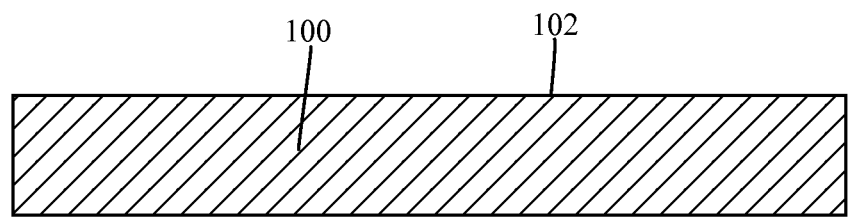
FIG. 1 is a simplified and schematically illustrated cross-sectional view of a substrate comprising molybdenum.

FIG. 1 illustrates a substrate 100 comprising molybdenum. The substrate 100 may comprise a generally planar wafer, for example, and may be at least substantially comprised of molybdenum. In other words, the substrate 100 may consist essentially of molybdenum. The molybdenum may have a polycrystalline microstructure. Thus, the substrate 100 may be at least substantially comprised of polycrystalline molybdenum.

The substrate 100 may have an exposed major surface 102 on which a III-V semiconductor material, such as GaN, may be provided, as discussed subsequently herein. The exposed major surface 102 may be at least substantially planar.

Figure 2:
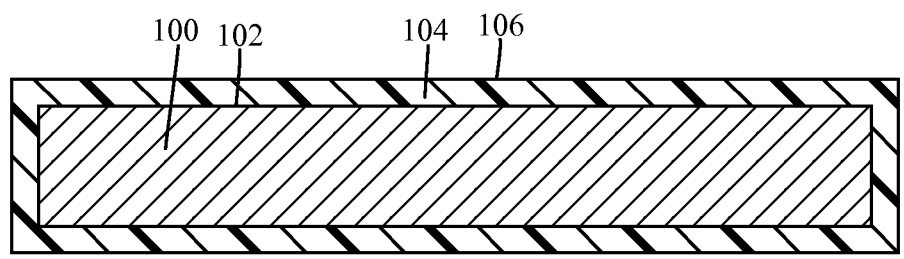
FIG. 2 illustrates molybdenum nitride at outer surfaces of the substrate shown in FIG. 1.

Referring to FIG. 2, molybdenum nitride 104 may be formed or otherwise provided at the exposed major surface 102 of the substrate 100. The molybdenum nitride 104 may comprise a MoN phase, a $Mo_2N$ phase, or both MoN and $Mo_2N$ phases. As shown in FIG. 2, in some embodiments, the substrate 100 may be at least substantially encapsulated with molybdenum nitride 104.

The molybdenum nitride 104 may be present in the form of a layer of molybdenum nitride 104, and the layer of molybdenum nitride 104 may have an average layer thickness of between about one nanometer (1 nm) and about five hundred nanometers (500 nm), and, more particularly, between about ten nanometers (10 nm) and about one hundred nanometers (100 nm).

The molybdenum nitride 104 may be formed by introducing nitrogen atoms into the surfaces of the substrate 100, such as the exposed major surface 102, and nitriding a volume of the molybdenum within the substrate 100. In other embodiments, the molybdenum nitride 104 may be formed by growing, depositing or otherwise forming a layer of molybdenum nitride 104 on the surfaces of the substrate 100.

As a non-limiting example, the molybdenum nitride 104 may be formed by exposing the substrate 100 to a microwave plasma comprising nitrogen radicals. In particular, an expanding plasma activated by microwave discharge may be directed onto surfaces of the substrate 100 comprising molybdenum that are to be nitrided. The plasma may be generated in an environment comprising a gas or gaseous mixture that includes nitrogen ($N_2$). In the case of gaseous mixtures, one or more of hydrogen gas ($H_2$) and inert gas (e.g., argon) may also be present. Such processes are discussed in further detail in, for example, Touimi et al., *A nitriding process of very thin molybdenum films in an expanding microwave plasma at low temperature*, IOP Conf. Series: Materials Science and Engineering 12 (2010), which is incorporated herein in its entirety by this reference.

As another non-limiting example, the molybdenum nitride 104 may be formed by utilizing a reactive sputtering process to deposit a molybdenum nitride film onto surfaces of the substrate 100 that are to include the molybdenum nitride 104. The substrate 100 may be provided within a sputter deposition system. An at least substantially pure molybdenum target may be used to sputter molybdenum during the sputter deposition process. Also, a gas or gaseous mixture that includes nitrogen ($N_2$) may be provided within the deposition system during the deposition process. In the case of gaseous mixtures, one or more of hydrogen gas ($H_2$) and inert gas (e.g., argon) may also be present. During the deposition process, the sputtered molybdenum may react with the nitrogen within the deposition system to deposit the molybdenum nitride 104 on the substrate 100. Such processes are discussed in further detail in, for example, Y. Wang and R. Lin, *Amorphous molybdenum nitride thin films prepared by reactive sputter deposition*, Materials Science & Engineering B, vol. 112, pp. 42-49 (Elsevier 2004), which is incorporated herein in its entirety by this reference.

As another non-limiting example, the molybdenum nitride 104 may be formed by atomic layer deposition (ALD) processes. For example, a molybdenum precursor, such as molybdenum pentachloride or bis(tert-butylimido)-bis(dimethylamido)molybdenum maybe utilized in an ALD process with a nitrogen precursor, such as ammonia. The molybdenum precursor and nitrogen precursor may be alternatively pulsed into a reaction chamber to form the molybdenum nitride 104. Such processes are discussed in further detail in, for example, V. Miikkulainen et al, *Atomic Layer Deposition of Molybdenum Nitride from Bis(tert-butylimido)-bis(dimethylamido)molybdenum and Ammonia onto Several Types of Substrate Materials with Equal Growth per Cycle*, Chem. Mater., vol. 19, pp. 263-269 (2007), which is incorporated herein in its entirety by this reference.

As yet another non-limiting example, the molybdenum nitride 104 may be formed by annealing the substrate 100 in an environment comprising nitrogen gas ($N_2$) and hydrogen gas ($H_2$) at a temperature greater than about 400° C., and, more particularly, at temperatures from about 400° C. to about 1,000° C. (e.g., about 650° C.). The volumetric ratio of hydrogen gas to nitrogen gas within the annealing chamber may be between about 0.05 and about 10.00. The annealing time may be from one (1) minute to one hundred (100) minutes or more. Such processes are discussed in further detail in, for example, T. Amazawa and H. Oikawa, *Nitridation of vacuum evaporated molybdenum films in $H_2/N_2$ mixtures*, J. Vac. Sci. Technol. A, vol. 16(4), July/August, pp. 2510-16 (1998), which is incorporated herein in its entirety by this reference.

The crystallinity of an exposed major surface 106 of the molybdenum nitride 104 may be less than a crystallinity of the exposed major surface 102 of the substrate 100 prior to formation of the molybdenum nitride 104. The exposed major surface 102 of the substrate 100 may have a polycrystalline microstructure. The molybdenum nitride 104 may be formed to have an amorphous microstructure in some embodiments. In other embodiments, the molybdenum nitride 104 may be formed to have a polycrystalline microstructure. In such embodiments, the molybdenum nitride 104 may be fanned to comprise material grains that exhibit an average grain size that is less than an average grain size of material grains at the exposed major surface 102 of the substrate 100 prior to formation of the molybdenum nitride 104. As a non-limiting example, the molybdenum nitride 104 may be formed to comprise material grains that exhibit an average grain size of about ten nanometers (10 nm) or less, and, more particularly, about two and one half nanometers (2.5 nm) or less.

By providing the molybdenum nitride 104 with an amorphous microstructure, or with a polycrystalline microstructure having a relatively fine grain structure, unwanted diffusion of molybdenum or other elements out from the substrate 100 and into subsequently formed overlying materials during subsequent processing may be hindered. Further, by encapsulating the substrate 100 in molybdenum nitride 104, the encapsulated substrate 100 may be subjected to environments that might otherwise consume or degrade the substrate 100, such as environments comprising chlorine gas and/or hydrochloric acid vapor at elevated temperatures.

Molybdenum nitride may exhibit a hardness that is greater than a hardness exhibited by elemental molybdenum. Thus, the molybdenum nitride 104 may be formed such that an exposed major surface 106 of the molybdenum nitride 104 exhibits a hardness that is higher than a hardness exhibited by the exposed major surface 102 of the substrate 100 prior to forming the molybdenum nitride 104. By way of example and not limitation, the exposed major surface 106 of the molybdenum nitride 104 may exhibit a Vickers hardness HV of at least about 175, and, more particularly, a Vickers hardness HV of about 200 or more.

Due to the increased hardness and reduced crystallinity of the exposed major surface 106 of the molybdenum nitride 104, it may be relatively easier to polish and smooth the exposed major surface 106 of the molybdenum nitride 104 in preparation for subsequent processing, relative to the underlying exposed major surface 102 of the substrate 100. Thus, after forming the exposed major surface 106 of the molybdenum nitride 104, the exposed major surface 106 of the molybdenum nitride 104 may be subjected to one or more of an a grinding process, a polishing process, and an etching process (e.g., a chemical-mechanical polishing (CMP) process) to reduce a surface roughness of the exposed major surface 106 of the molybdenum nitride 104. Thus, the molybdenum nitride 104 may be formed such that an exposed major surface 106 of the molybdenum nitride 104 exhibits a surface roughness Ra that is less than a surface roughness Ra of the exposed major surface 102 of the substrate 100 prior to forming the molybdenum nitride 104. By way of example and not limitation, the surface roughness Ra of the exposed major surface 106 of the molybdenum nitride 104 may be about five nanometers (5 nm) or less, about three nanometers (3 nm) or less, or even about two nanometers (2 nm) or less. In embodiments in which the molybdenum nitride 104 has an amorphous microstructure, the molybdenum nitride 104 may exhibit such levels of surface roughness upon formation of the molybdenum nitride 104 without the need for subsequent polishing or etching, as there may be no roughness resulting from the presence of grain boundaries.

After providing the molybdenum nitride 104 on the substrate 100, a III-V semiconductor material may be provided over the at least substantially planar exposed major surface 102 of the substrate 100. As a non-limiting example, a layer of GaN may be provided over the at least substantially planar exposed major surface 102 of the substrate 100 as subsequently described, although other III-V semiconductor materials may be provided in additional embodiments.

A layer of GaN may be provided over the at least substantially planar exposed major surface 102 of the substrate 100 by bonding a separately formed layer of GaN to the exposed major surface 106 of the molybdenum nitride 104, or by growing or otherwise depositing GaN on the exposed major surface 106 of the molybdenum nitride 104.

In some embodiments, a layer of GaN may be provided over the at least substantially planar exposed major surface 102 of the substrate 100 by transferring a layer of GaN from a donor structure onto the exposed major surface 106 of the molybdenum nitride 104. By way of example and not limitation, the process known in the art as the SMART-CUT® process may be used to transfer a layer of GaN from a donor structure onto the exposed major surface 106 of the molybdenum nitride 104.

The SMART-CUT® process is described in, for example, U.S. Pat. No. RE39,484 to Bruel (issued Feb. 6, 2007), U.S. Pat. No. 6,303,468 to Aspar et al. (issued Oct. 16, 2001), U.S. Pat. No. 6,335,258 to Aspar et al. (issued Jan. 1, 2002), U.S. Pat. No. 6,756,286 to Moriceau et al. (issued Jun. 29, 2004), U.S. Pat. No. 6,809,044 to Aspar et al. (issued Oct. 26, 2004), and U.S. Pat. No. 6,946,365 to Aspar et al. (Sep. 20, 2005), the disclosures of which are incorporated herein in their entireties by this reference.

Figure 3:
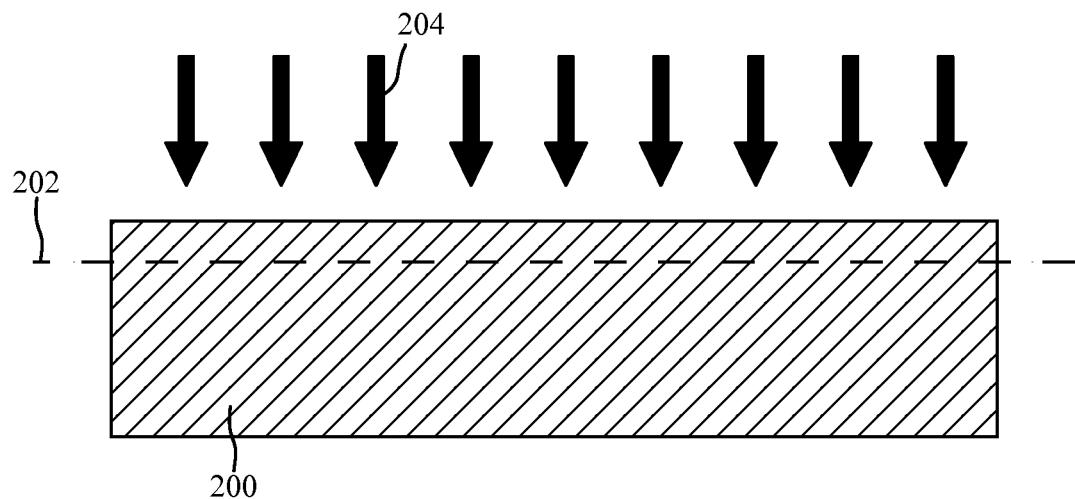
FIG. 3 illustrates ions being implanted into a donor structure comprising a III-V semiconductor material.

The SMART-CUT® process is briefly described below with reference to FIGS. 3 through 6. Referring to FIG. 3, a plurality of ions (e.g., one or more of hydrogen, helium, or inert gas ions) may be implanted into a donor structure 200 along an ion implant plane 202. The donor structure 200 may comprise a bulk crystalline semiconductor material, such as monocrystalline GaN. The implantation of ions is represented in FIG. 3 by directional arrows 204. The implanted ions along the ion implant plane 202 define a weakened ion implant plane within the donor structure 200, along which the donor structure 200 subsequently may be cleaved or otherwise fractured. As known in the art, the depth at which the ions are implanted into the donor structure 200 is at least partially a function of the energy with which the ions are implanted into the donor structure 200. Generally, ions implanted with less energy will be implanted at relatively shallower depths, while ions implanted with higher energy will be implanted at relatively deeper depths.

Figure 4:
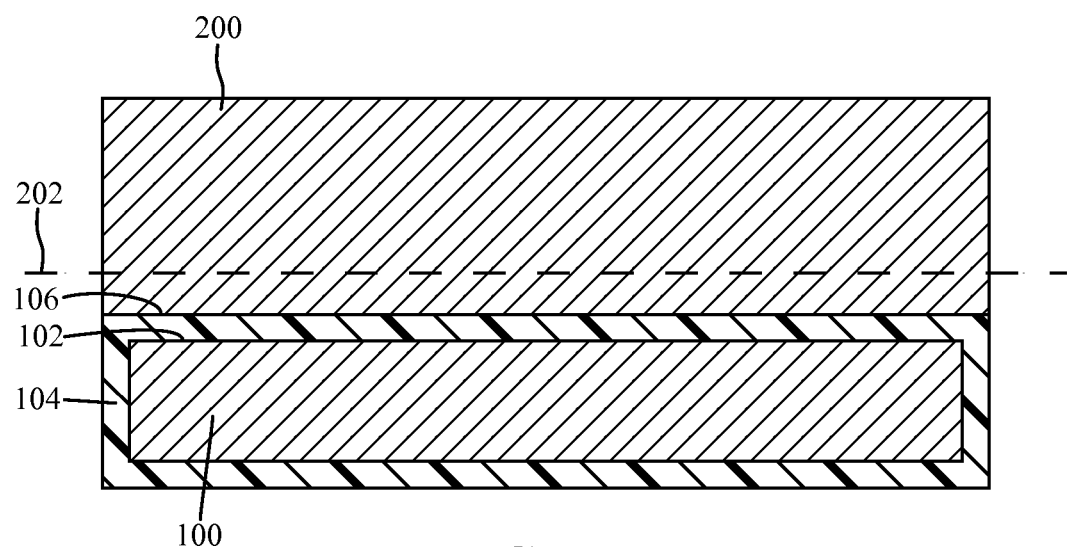
FIG. 4 illustrates the donor structure of FIG. 3 bonded to the substrate having molybdenum nitride thereon as shown in FIG. 2.

Referring to FIG. 4, the donor structure 200 is bonded to the major surface 106 of the molybdenum nitride 104 on the substrate 100, after which the donor structure 200 is cleaved or otherwise fractured along the ion implant plane 202. To bond the donor structure 200 to the molybdenum nitride 104, the bonding surfaces of the donor structure 200 and the molybdenum nitride 104 may be brought into direct physical contact and direct molecular bonds may be established between the molybdenum nitride 104 and the donor structure 200 to form the structure shown in FIG. 4.

After the bonding process, the bonded donor structure 200 may be cleaved or otherwise fractured along the ion implant plane 202. For example, the donor structure 200 (with the substrate 100 bonded thereto) may be heated to cause the donor structure 200 to fracture along the ion implant plane 202. Optionally, mechanical forces may be applied to the donor structure 200 to assist in the cleaving of the donor structure 200 along the ion implant plane 202.

Figure 5:
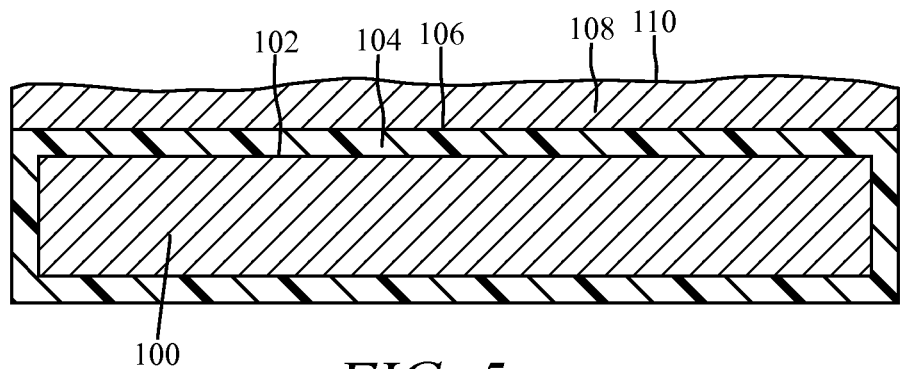
FIG. 5 illustrates a layer of III-V semiconductor material transferred from the donor structure of FIG. 3 to the substrate having molybdenum nitride thereon.
Figure 6:
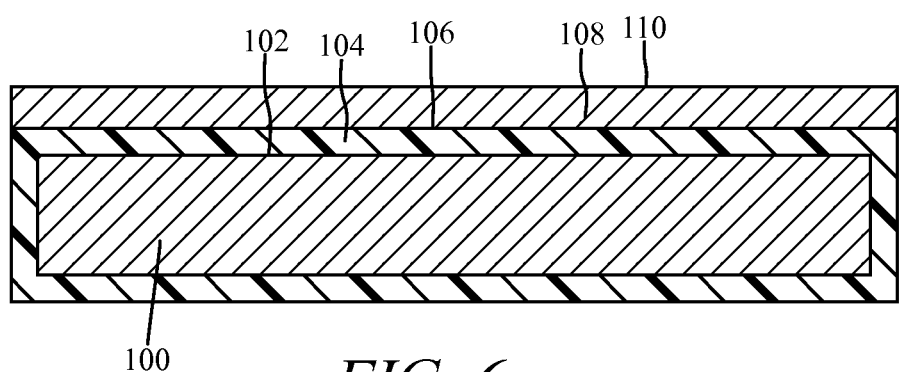
FIG. 6 illustrates the structure of FIG. 5 after polishing an exposed major surface thereof.

As shown in FIG. 5, after the donor structure 200 has been cleaved or otherwise fractured along the ion implant plane 202, a portion of the donor structure 200 remains bonded to the molybdenum nitride 104 over the exposed major surface 102 of the substrate 100, which portion defines a layer of GaN 108. A remainder of the donor structure 200 may be reused in further SMART-CUT® processes to transfer additional portions of the donor structure 200 to additional substrates.

After the fracturing process, an exposed major surface 110 of the layer of GaN 108 comprises a fractured surface of the donor structure 200, and may include ion impurities and imperfections in the crystal lattice of the layer of GaN 108. The GaN 108, in some applications, may comprise a single crystal of GaN (i.e., monocrystalline GaN). The layer of GaN 108 may be treated in an effort to reduce impurity levels and improve the quality of the crystal lattice (i.e., reduce the number of defects in the crystal lattice proximate the exposed major surface 110) in the layer of GaN 108. Such treatments may involve one or more of grinding, polishing, etching, and thermal annealing.

In other embodiments, the layer of GaN 108 may be provided on the molybdenum nitride 104 over the exposed major surface 102 of the substrate 100 by epitaxially growing or otherwise depositing the layer of GaN 108 on the molybdenum nitride 104, or by bonding bulk crystalline GaN to the molybdenum nitride 104 and subsequently thinning the bulk crystalline GaN using one or more of a grinding process, a polishing process, and an etching process (e.g., a chemical-mechanical polishing process).

Figure 7:
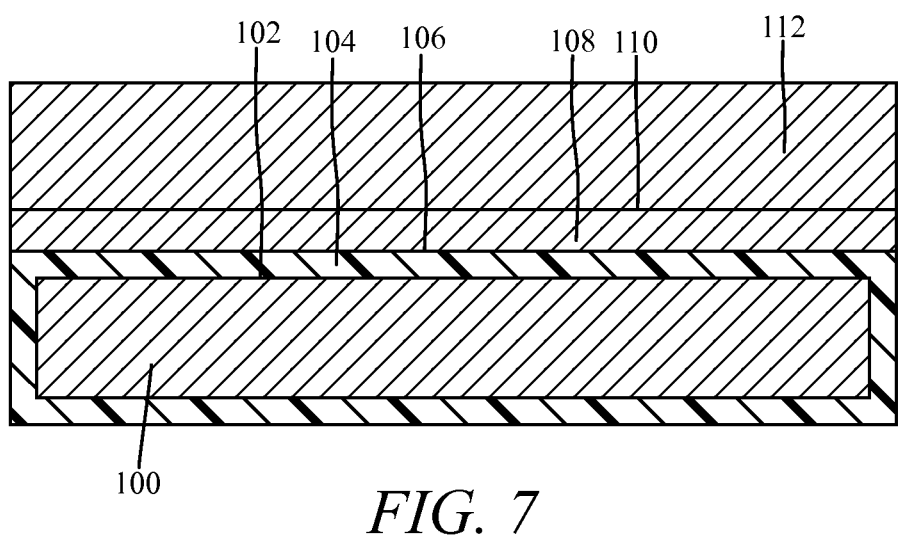
FIG. 7 illustrates an additional epitaxial layer of III-V semiconductor material formed over the transferred layer of III-V semiconductor material.

Referring to FIG. 7, one or more additional layers of III-V semiconductor material may be provided over the layer of GaN 108. For example, as shown in FIG. 7, an additional layer 112 comprising GaN or InGaN may be epitaxially grown on the layer of GaN 108. Optionally, active device structures (such as active regions, transistors, conductive lines and vias, etc.) may be subsequently fabricated in and/or on the additional layer 112 of GaN or InGaN to complete formation of an active semiconductor device, such as a radiation-emitting device (e.g., a light-emitting diode (LED), a laser diode, etc.) or a radiation receiving device (e.g., an optical sensor, a solar cell, etc.).

Molybdenum exhibits a coefficient of thermal expansion (CTE) of about $5.5 \times 10^{-6}$ K$^{-1}$, and GaN exhibits a closely matching CTE of about $5.6 \times 10^{-6}$ K$^{-1}$. By providing the layer of GaN 108 on a substrate 100 comprising molybdenum, problems associated with mismatch between the coefficients of thermal expansion of the layer of GaN 108 and the substrate 100 may be avoided when the layer of GaN 108 and the substrate 100 are heated and cooled during epitaxial growth of the additional layer 112 comprising GaN or InGaN and other subsequent processing. Further, by providing the molybdenum nitride 104 on the substrate 100 as described herein, improved bonding between the layer of GaN 108 and the substrate 100 may be attained. Further, problems associated with processing exposed elemental molybdenum may be avoided by encapsulating the substrate 100 comprising molybdenum with molybdenum nitride 104, as previously described herein. Methods similar to those described herein may be applied to other substrates comprising metals or metal alloys and overlying layers of other types of semiconductor material, wherein the substrates and the semiconductor materials have closely matching coefficients of thermal expansion (e.g., coefficients of thermal expansion within about two and one-half percent (2.5%) of one another), by providing a metal nitride at outer surfaces of the substrate prior to bonding.

Additional non-limiting example embodiments of the disclosure are set forth below.

Embodiment 1: A method of fabricating a semiconductor structure, comprising: forming molybdenum nitride at an at least substantially planar surface of a substrate comprising molybdenum; and providing a layer of GaN over the at least substantially planar surface of the substrate.

Embodiment 2: The method of Embodiment 1, further comprising selecting the substrate to be at least substantially comprised of molybdenum.

Embodiment 3: The method of Embodiment 2, further comprising selecting the substrate to be at least substantially comprised of polycrystalline molybdenum.

Embodiment 4: The method of any one of Embodiments 1 through 3, wherein forming molybdenum nitride at the at least substantially planar surface of the substrate comprises at least substantially encapsulating the substrate with molybdenum nitride.

Embodiment 5: The method of any one of Embodiments 1 through 4, wherein forming molybdenum nitride at the at least substantially planar surface of the substrate comprises introducing nitrogen into the at least substantially planar surface of the substrate and forming the molybdenum nitride in the at least substantially planar surface of a substrate.

Embodiment 6: The method of any one of Embodiments 1 through 4, wherein forming molybdenum nitride at the at least substantially planar surface of the substrate comprises depositing molybdenum nitride on the at least substantially planar surface of the substrate.

Embodiment 7: The method of Embodiment 6, wherein depositing molybdenum nitride on the at least substantially planar surface of the substrate comprises depositing the molybdenum nitride using at least one of a chemical vapor deposition process, a sputtering process, and an atomic layer deposition process.

Embodiment 8: The method of any one of Embodiments 1 through 4, wherein forming molybdenum nitride at the at least substantially planar surface of the substrate comprises growing molybdenum nitride on the at least substantially planar surface of the substrate.

Embodiment 9: The method of any one of Embodiments 1 through 8, wherein forming molybdenum nitride at the at least substantially planar surface of the substrate comprises providing an exposed major surface of the molybdenum nitride with a surface roughness less than a surface roughness of the at least substantially planar surface of the substrate.

Embodiment 10: The method of any one of Embodiments 1 through 9, wherein forming molybdenum nitride at the at least substantially planar surface of the substrate comprises providing an exposed major surface of the molybdenum nitride with a crystallinity less than a crystallinity of the at least substantially planar surface of the substrate.

Embodiment 11: The method of Embodiment 10, wherein providing the exposed major surface of the molybdenum nitride with a crystallinity less than a crystallinity of the at least substantially planar surface of the substrate prior to forming the molybdenum nitride comprises forming the molybdenum nitride to comprise amorphous molybdenum nitride.

Embodiment 12: The method of Embodiment 10, wherein providing the exposed major surface of the molybdenum nitride with a crystallinity less than a crystallinity of the at least substantially planar surface of the substrate prior to forming the molybdenum nitride comprises forming the molybdenum nitride to comprise material grains having an average grain size less than an average grain size of material grains of the substrate at the exposed major surface of the substrate.

Embodiment 13: The method of any one of Embodiments 1 through 12, wherein forming molybdenum nitride at the at least substantially planar surface of the substrate comprises exposing the substrate to a microwave plasma comprising nitrogen radicals.

Embodiment 14: The method of any one of Embodiments 1 through 12, wherein forming molybdenum nitride at the at least substantially planar surface of the substrate comprises utilizing a reactive sputtering process to deposit a molybdenum nitride film on the at least substantially planar surface of the substrate.

Embodiment 15: The method of any one of Embodiments 1 through 12, wherein forming molybdenum nitride at the at least substantially planar surface of the substrate comprises annealing the substrate in an environment comprising nitrogen and hydrogen at a temperature greater than about 400° C.

Embodiment 16: The method of any one of Embodiments 1 through 15, wherein forming molybdenum nitride at the at least substantially planar surface of the substrate comprises forming an exposed major surface of the molybdenum nitride to exhibit a hardness greater than a hardness exhibited by the exposed major surface of the substrate.

Embodiment 17: The method of Embodiment 16, further comprising forming the exposed major surface of the molybdenum nitride to exhibit a Vickers hardness HV of about 175 or more.

Embodiment 18: The method of any one of Embodiments 1 through 17, further comprising subjecting an exposed major surface of the molybdenum nitride to at least one of a grinding process, a polishing process, and an etching process.

Embodiment 19: The method of any one of Embodiments 1 through 18, wherein providing a layer of GaN over the at least substantially planar surface of the substrate comprises bonding the layer of GaN to an exposed major surface of the molybdenum nitride.

Embodiment 20: The method of Embodiment 19, wherein providing a layer of GaN over the at least substantially planar surface of the substrate comprises: implanting ions into a GaN donor structure and forming a weakened ion implant plane within the GaN donor structure, the layer of GaN defined on a side of the weakened ion implant plane; bonding the GaN donor structure to the exposed major surface of the molybdenum nitride; and fracturing the GaN donor structure along the weakened ion implant plane leaving the layer of GaN bonded to the exposed major surface of the molybdenum nitride.

Embodiment 21: The method of any one of Embodiments 1 through 20, further comprising epitaxially growing at least one layer of III-V semiconductor material on the layer of GaN.

Embodiment 22: A semiconductor structure, comprising: a substrate comprising molybdenum; molybdenum nitride at an at least substantially planar surface of the substrate; and a layer of GaN bonded to the molybdenum nitride.

Embodiment 23: The semiconductor structure of Embodiment 22, wherein the substrate is at least substantially comprised of molybdenum.

Embodiment 24: The semiconductor structure of Embodiment 23, wherein the substrate is at least substantially comprised of polycrystalline molybdenum.

Embodiment 25: The semiconductor structure of any one of Embodiments 22 through 22, wherein the molybdenum nitride comprises a layer of molybdenum nitride disposed between the substrate and the layer of GaN.

Embodiment 26: The semiconductor structure of Embodiment 25, wherein the layer of molybdenum nitride has an average layer thickness of between about one nanometer (1 nm) and about five hundred nanometers (500 nm).

Embodiment 27: The semiconductor structure of any one of Embodiments 22 through 26, wherein the molybdenum nitride comprises at least one of MoN and $Mo_2N$.

Embodiment 28: The semiconductor structure of any one of Embodiments 22 through 27, wherein the substrate is at least substantially encapsulated with molybdenum nitride.

Embodiment 29: The semiconductor structure of any one of Embodiments 22 through 28, wherein the molybdenum nitride comprises amorphous molybdenum nitride.

Embodiment 30: The semiconductor structure of any one of Embodiments 22 through 28, wherein the molybdenum nitride comprises polycrystalline molybdenum nitride having an average grain size of about ten nanometers (10 nm) or less.

Embodiment 31: The semiconductor structure of any one of Embodiments 22 through 30, wherein the layer of GaN is bonded to the molybdenum nitride with direct molecular bonds.

Embodiment 32: The semiconductor structure of any one of Embodiments 22 through 31, further comprising at least one epitaxial layer of III-V semiconductor material on the layer of GaN.

The example embodiments of the disclosure described above do not limit the scope of the invention, since these embodiments are merely examples of embodiments of the invention, which is defined by the scope of the appended claims and their legal equivalents. Any equivalent embodiments are intended to be within the scope of this invention. Indeed, various modifications of the disclosure, in addition to those shown and described herein, such as alternative useful combinations of the elements described, will become apparent to those skilled in the art from the description. Such modifications and embodiments are also intended to fall within the scope of the appended claims.

What is claimed is:

1. A semiconductor structure, comprising:
   a substrate comprising molybdenum;
   molybdenum nitride at an at least substantially planar surface of the substrate; and
   a layer of GaN directly, molecularly bonded to the molybdenum nitride such that a bonding interface is present between the GaN and the molybdenum nitride.

2. The semiconductor structure of claim 1, wherein the substrate is at least substantially comprised of molybdenum.

3. The semiconductor structure of claim 2, wherein the substrate is at least substantially comprised of polycrystalline molybdenum.

4. The semiconductor structure of claim 1, wherein the molybdenum nitride comprises a layer of molybdenum nitride disposed between the substrate and the layer of GaN.

5. The semiconductor structure of claim 4, wherein the layer of molybdenum nitride has an average layer thickness of between about one nanometer (1 nm) and about five hundred nanometers (500 nm).

6. The semiconductor structure of claim 1, wherein the molybdenum nitride comprises at least one of MoN and $Mo_2N$.

7. The semiconductor structure of claim 1, wherein the substrate is at least substantially encapsulated with molybdenum nitride.

8. The semiconductor structure of claim 1, wherein the molybdenum nitride comprises amorphous molybdenum nitride.

9. The semiconductor structure of claim 1, wherein the molybdenum nitride comprises polycrystalline molybdenum nitride having an average grain size of about ten nanometers (10 nm) or less.

10. The semiconductor structure of claim 1, further comprising at least one epitaxial layer of III-V semiconductor material on the layer of GaN.

11. The semiconductor structure of claim 10, wherein the at least one epitaxial layer of III-V semiconductor material comprises at least one epitaxial layer of at least one of GaN, GaP, GaAs, InN, InP, InAs, AlN, AlP, AlAs, InGaN, InGaP, InAlN, AlGaN, InGaNP, and GaInNAs.

12. The semiconductor structure of claim 11, wherein the at least one epitaxial layer of III-V semiconductor material comprises at least one epitaxial layer of InGaN.

13. The semiconductor structure of claim 1, wherein the substrate comprising molybdenum is a wafer comprising molybdenum.

14. A semiconductor structure, comprising:
   a molybdenum substrate;
   a layer of molybdenum nitride at a surface of the substrate;
   a first layer of III/V semiconductor material directly, molecularly bonded to the molybdenum nitride; and
   at least one additional layer of III/V semiconductor material epitaxially grown over the first layer of III/V semiconductor material on a side thereof opposite the layer of molybdenum nitride.

15. The semiconductor structure of claim 14, wherein the first layer of III/V semiconductor material comprises a layer of GaN.

16. The semiconductor structure of claim 14, wherein the molybdenum substrate consists essentially of molybdenum.

17. The semiconductor structure of claim 14, wherein the layer of molybdenum nitride has an average layer thickness of between about one nanometer (1 nm) and about five hundred nanometers (500 nm).

18. The semiconductor structure of claim 14, wherein the molybdenum nitride comprises amorphous molybdenum nitride.

19. The semiconductor structure of claim 14, wherein the at least one additional layer of III/V semiconductor material comprises at least one of GaN, GaP, GaAs, InN, InP, InAs, AN, AlP, AlAs, InGaN, InGaP, InAlN, AlGaN, InGaNP, and GaInNAs.

* * * * *

UNITED STATES PATENT AND TRADEMARK OFFICE
CERTIFICATE OF CORRECTION

Page 1 of 1

PATENT NO. : 9,716,148 B2
APPLICATION NO. : 14/579390
DATED : July 25, 2017
INVENTOR(S) : Christiaan J. Werkhoven It is certified that error appears in the above-identified patent and that said Letters Patent is hereby corrected as shown below:

In the Specification
    Column 1, Line 21, change "structures fanned by" to --structures formed by--
    Column 3, Line 47, change "InAs, AN, AlP" to --InAs, AlN, AlP--
    Column 5, Line 33, change "be fanned to" to --be formed to--

In the Claims
Claim 19, Column 12, Line 36, change "AN, AlP, AlAs" to --AlN, AlP, AlAs--

Signed and Sealed this
Twenty-third Day of January, 2018

Joseph Matal
*Performing the Functions and Duties of the
Under Secretary of Commerce for Intellectual Property and
Director of the United States Patent and Trademark Office*